United States Patent [19]

Jang

[11] Patent Number: 5,182,226
[45] Date of Patent: Jan. 26, 1993

[54] METHOD FOR FABRICATION OF A FIELD OXIDE OF THE BURIED INVERSE T-TYPE USING OXYGEN OR NITROGEN ION IMPLANTATION

[75] Inventor: Seong J. Jang, Seoul, Rep. of Korea

[73] Assignee: Gold Star Electron Co., Ltd., Rep. of Korea

[21] Appl. No.: 856,020

[22] Filed: Mar. 23, 1992

[30] Foreign Application Priority Data

Apr. 15, 1991 [KR] Rep. of Korea ............... 6019/1991

[51] Int. Cl.⁵ ........................................... H01L 21/76
[52] U.S. Cl. ........................................ 437/70; 437/26; 437/27; 437/69; 437/61
[58] Field of Search ............... 437/72, 73, 26, 27, 437/69, 70

[56] References Cited

U.S. PATENT DOCUMENTS 4,975,126  12/1990  Margail et al. ............... 437/26

FOREIGN PATENT DOCUMENTS 0115547  9/1981  Japan ............... 437/69
0179431  7/1989  Japan ............... 437/26
0205552  8/1989  Japan ............... 437/69
0240230  10/1991  Japan ............... 437/26

*Primary Examiner*—Brian E. Hearn
*Assistant Examiner*—Trung Dang
*Attorney, Agent, or Firm*—Faegre & Benson

[57] ABSTRACT

The present invention relates to a semiconductor and a method for fabrication thereof and particularly to a semiconductor having a field oxide having a shape such that the lower part is wider that the upper part. Therefore, according to the present invention, the ion implantation process for forming a channel stop region becomes unnecessary, because of the effect of accurate insulation between the devices and the pn junction area can be decreased, so that the junction capacitance becomes decreased. Furthermore, because LOCOS edge does not coincide with the junction edge, the leakage current due to the damage of the edge is not generated. Because a field oxide is of the buried inverse T-type, the effective width of the device is increased more than that of a mask. Because the bird's beak is not generated, the problem due to the narrow width can be settled.

5 Claims, 2 Drawing Sheets

METHOD FOR FABRICATION OF A FIELD OXIDE OF THE BURIED INVERSE T-TYPE USING OXYGEN OR NITROGEN ION IMPLANTATION

BACKGROUND OF THE INVENTION

The present invention relates to a semiconductor device and a method for fabrication thereof having a field oxide of the buried inverse T-type suited to submicron MOS devices.

FIG. 1 shows a cross-sectional view of a semiconductor device where a field oxide is formed using a conventional LOCOS process (Local Oxidation of Silicon).

In the prior art, when MOS devices are fabricated, the field oxide is formed using the conventional LOCOS to isolate devices.

Thus, as shown in FIG. 1, a field oxide layer 2 is grown on a field region of a Si substrate 1 using a nitride layer (not shown herein) and a gate 3 is formed at a predetermined region, and then predetermined impurities are implanted on both sides of gate 3 to form the source and drain regions 4.

Furthermore, because, when the field oxide 2 is grown, it penetrates only a little within Si substrate 1, predetermined impurities are implanted in a field region to form a channel stop for insulation transistors.

However, the conventional fabrication process for forming the field oxide has disadvantages in that the effective area of the device is decreased, because of the generation of the bird beak and the capacitance is increased due to the pn junction. Furthermore, leakage current is generated by the damage of the edge portion, so that it is not able to completely insulate the device.

SUMMARY OF THE INVENTION

It is an object of the present invention to provide a semiconductor device having a field oxide of the buried inverse T-type.

It is another object of the present invention to provide a method for fabrication of the semiconductor device for forming a field oxide of the buried inverse T-type using oxygen or nitrogen ion implantation.

To achieve this object of the present invention, there is provided a semiconductor device isolated by a field oxide in the shape of a buried inverse T, in which the lower part is wider than the upper part.

And, there is provided a method for fabrication of the semiconductor device, which comprises the steps of:

successively depositing a pad nitride film, a first nitride film and a first oxide film on a Si substrate;
exposing the Si substrate of field region and forming the side wall of a second nitride film;
implanting ion impurities into the exposed substrate to a predetermined depth;
removing the first oxide film and second nitride film and successively depositing a second oxide film and a second nitride film on the whole surface;
etching the third nitride film to expose the fixed portion of the Si substrate;
implanting the impurities with lower energy than the first ion implantation;
forming a field oxide by heat treatment of the impurities implanted within the substrate;
removing the remaining third nitride film, second nitride film, first nitride film and pad nitride film; and
forming a transistor in an active region isolated by the field oxide.

BRIEF DESCRIPTION OF THE INVENTION

The features and advantages of the present invention will be more clearly appreciated from the following description of the preferred embodiments of the invention taken in conjunction with the accompanying drawings in which.

DETAILED DESCRIPTION OF THE INVENTION

Figure 1:
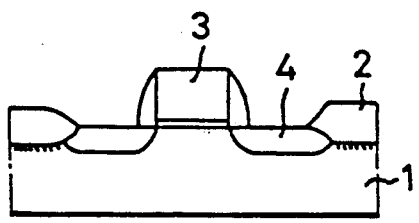
FIG. 1 is a cross-sectional view of a semiconductor device in which a field oxide is formed using the conventional LOCOS.

A semiconductor device and a method for fabrication thereof according to the present invention will be described in more detail with reference to the various views in accompanying FIG. 2.

FIGS. 2A through 2E are cross-sectional views of the device after completion of various steps in a fabrication process for manufacturing a semiconductor device having the buried inverse T-type according to a preferred embodiment of the present invention.

A pad nitride film 12, a first nitride film 13 and a first oxide film 14 are successively deposited on a Si substrate 11. The Si substrate 11 of the field region is exposed by using an active mask (not shown herein).

Then, the second nitride film is thinly deposited and then etched by an RIE process to form the side wall 15.

The fixed impurities, such as the oxygen ions or the nitrogen ions, are then implanted into the exposed Si substrate 11 to a predetermined depth.

Herein, the first ion implantation condition is that the impurities should be implanted into the surface of the Si substrate 11 to a depth of about 0.5 $\mu$m with an energy of from about 150 to 250 KeV.

Furthermore, amount of the dose is on the order of from $10^{17}/cm^2$ to $10^{19}/cm^2$.

Figure 2A:
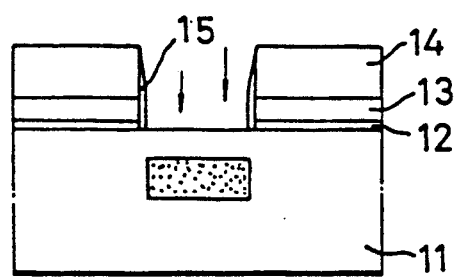
FIGS. 2A through 2E are cross-sectional views illustrating the device after various operations in a fabrication process forming a field oxide of the buried inverse T-type according to a preferred embodiment of the present invention.
Figure 2B:
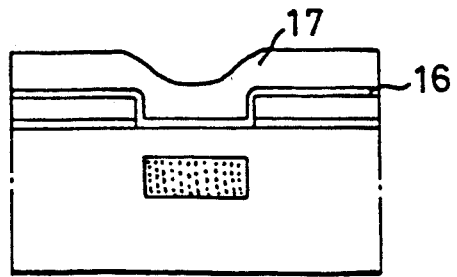

Henceforth, as shown in FIG. 2B, the first oxide film 14 and the side wall 15 are removed and the second oxide film 16 and the third nitride film 17 are successively deposited on the whole surface.

Figure 2C:
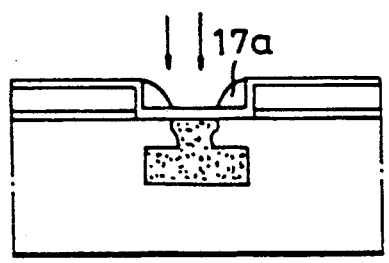

Then, as shown in FIG. 2C, the third nitride film 17 is etched by RIE to form the side wall 17a, and the oxygen ions or the nitrogen ions are implanted with lower energy against the Si substrate 11.

Herein, the ion implantation condition is that the impurities should be implanted from the surface of the Si substrate 11 to a depth of about 0.5 $\mu$m with energy of from about 150 to 250 KeV.

Furthermore, amount of the dose is on the order of from $10^{17}/cm^2$ to $10^{19}/cm^2$.

Henceforth, as shown in FIG. 2B, the first oxide film 14 and the side wall 15 are removed and a second oxide film 16 and a third nitride film 17 are successively deposited over the whole surface.

Then, as shown in FIG. 2C, the third nitride film 17 is etched by an RIE process to form a side wall 17A, and oxygen ions or nitrogen ions are implanted with lower energy into the Si substrate 11.

Herein, the second ion implantation condition is that the impurities should be implanted from the surface of the Si substrate 11 to a depth of about 0.5 μm with energy of from about 50 to 100 KeV.

Furthermore, the amount of the dose is on the order of from $10^{17}/cm^2$ to $10^{19}/cm^2$.

Figure 2D:
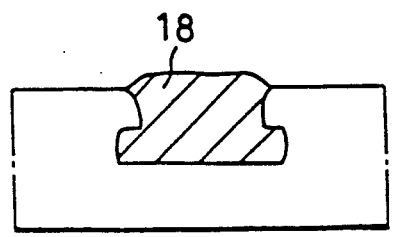

Henceforth, as shown in FIG. 2D, a heat treatment process of about 800° to 950° is performed at the oxygen ion implanted region to form a field oxide 18.

Then the side wall, the second oxide film 16, the first nitride film 13 and the pad nitride film 12 are removed. Accordingly, the field oxide 18 of the buried inverse T-type is formed.

Figure 2E:
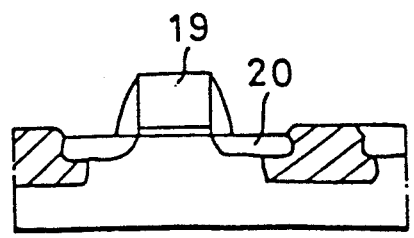

Henceforth, as shown in FIG. 2E, the gate 19 and the source and drain region 20 are formed in the active region of the isolated field oxide 18 of the buried inverse T-type according to the present invention.

According to the present invention use, the ion implantation process for forming a channel stop region becomes unnecessary, because of the effect of accurate insulation between the devices and the pn junction area can be decreased, so that the junction capacitance becomes decreased.

Furthermore, because the LOCOS edge does not coincide with the junction edge, the leakage current due to the damage of the edge is not generated. Because the field oxide is of the buried inverse T-type, the effective width of the device is increased more than that of a mask. Because the bird's beak is not generated, the problem due to the narrow width can be settled. It will be understood by those skilled in the art that the foregoing description is in terms of a preferred embodiment of the present invention, wherein various changes and modifications may be made without departing from the spirit and scope of the invention, as set forth in the appended claims.

What is claimed is:

1. A method for fabrication of a semiconductor device comprising:

successively depositing a pad nitride film, a first nitride film and a first oxide film on a Si substrate;

exposing the Si substrate of field region and forming a side wall of a second nitride film;

implanting ion impurities into the exposed substrate to a first depth, using a first ion implantation operation with a first energy range;

removing the first oxide film and the second nitride film and successively depositing a second oxide film and a third nitride film on a whole surface;

etching the third nitride film to expose a fixed portion of the Si substrate;

implanting ion impurities into said fixed portion of the substrate to a second depth, using a second ion implantation operation with a second energy range lower than the first ion impurity implantation operation;

forming a field oxide by heat treatment of the impurities implanted within said substrate;

removing the remaining third nitride film, second nitride film, first nitride film and pad nitride film; and forming a transistor in an active region isolated by the field oxide.

2. A method for fabrication of a semiconductor device according to claim 1, wherein said third nitride film is etched by using RIE to form a side wall.

3. A method for fabrication of a semiconductor device according to claim 1, wherein said first ion implantation operation uses oxygen ions or nitrogen ions as an impurity, said second energy range is from about 150 KeV to 250 KeV and the amount of dose is about $10^{17}/cm^2$ to $10^{19}/cm^2$.

4. A method for fabrication of a semiconductor device according to claim 1, wherein said second ion implantation operation uses oxygen ions or nitrogen ions as an impurity, said second energy range is from about 50 KeV to 100 KeV and the amount of dose is about $10^{17}/cm^2$ to $10^{19}/cm^2$.

5. A method for fabrication of a semiconductor device according to claim 1, wherein said first depth is from 0.5 μm to 0.2 μm and said second depth is about 0.2 μm from the surface of the si substrate.

* * * * *

UNITED STATES PATENT AND TRADEMARK OFFICE
CERTIFICATE OF CORRECTION

PATENT NO. : 5,182,226

DATED : January 26, 1993

INVENTOR(S) : Seong J. Jang

It is certified that error appears in the above-identified patent and that said Letters Patent is hereby corrected as shown below:

Column 4, Line 29, delete "second" and insert --first--

Signed and Sealed this

Twenty-ninth Day of March, 1994

Attest:

BRUCE LEHMAN

Attesting Officer          Commissioner of Patents and Trademarks